US010731253B2

(12) United States Patent
Huang et al.

(10) Patent No.: US 10,731,253 B2
(45) Date of Patent: Aug. 4, 2020

(54) GAS INJECTOR USED FOR SEMICONDUCTOR EQUIPMENT

(71) Applicant: HERMES-EPITEK CORPORATION, Taipei (TW)

(72) Inventors: Tsan-Hua Huang, Tainan (TW); Kian-Poh Wong, Hsinchu (TW); Chia-Ying Lin, Yunlin County (TW)

(73) Assignee: Hermes-Epitek Corporation, Taipei (TW)

( * ) Notice: Subject to any disclaimer, the term of this patent is extended or adjusted under 35 U.S.C. 154(b) by 388 days.

(21) Appl. No.: 15/871,618

(22) Filed: Jan. 15, 2018

(65) Prior Publication Data
US 2018/0202044 A1   Jul. 19, 2018

(30) Foreign Application Priority Data

Jan. 17, 2017  (TW) .............................. 106101498 A

(51) Int. Cl.
  *C23C 16/455*   (2006.01)
  *C23C 16/458*   (2006.01)
  *C23C 16/44*    (2006.01)

(52) U.S. Cl.
  CPC .... *C23C 16/45563* (2013.01); *C23C 16/4409* (2013.01); *C23C 16/4584* (2013.01); *C23C 16/45572* (2013.01); *C23C 16/45587* (2013.01)

(58) Field of Classification Search
  CPC ........ C23C 16/45563; C23C 16/45572; C23C 16/4584; C23C 16/45587; C23C 16/4409
  See application file for complete search history.

(56) References Cited

U.S. PATENT DOCUMENTS

| 3,408,982 A | * | 11/1968 | Capita | ..................... C23C 16/46 118/730 |
| 5,016,567 A | * | 5/1991 | Iwabuchi | ................ C23C 16/44 118/715 |
| 5,063,031 A | * | 11/1991 | Sato | ........................ C23C 16/46 29/25.01 |
| 5,217,560 A | * | 6/1993 | Kurono | ............... H01J 37/3244 118/723 R |
| 5,554,222 A | * | 9/1996 | Nishihara | ........... C23C 16/4584 118/708 |

(Continued)

FOREIGN PATENT DOCUMENTS

TW        200507050 A     2/2005

OTHER PUBLICATIONS

Office Action dated Mar. 1, 2017 in corresponding Taiwan Patent Application No. 106101498.

*Primary Examiner* — Jeffrie R Lund
(74) *Attorney, Agent, or Firm* — Donald E. Stout; Stout, Uxa & Buyan, LLP

(57) ABSTRACT

A gas injector used for semiconductor equipment includes a housing shell, a rotating main shaft and a gas output distribution unit. The rotating main shaft is covered with the housing shell, and includes a plurality of magnetic fluid seals and a plurality of gas transmission tubes. The gas output distribution unit is coupled to a top end of the rotating main shaft, the gas output distribution unit being connected to a ceiling and a susceptor. The gas output distribution unit includes a plurality of boards spaced at intervals between the ceiling and the susceptor, thereby resulting in a plurality of gas output layers for outputting corresponding reaction gases.

17 Claims, 9 Drawing Sheets

(56) References Cited

U.S. PATENT DOCUMENTS

| | | | | |
|---|---|---|---|---|
| 5,799,951 A * | 9/1998 | Anderson | .............. | F16J 15/43 277/301 |
| 6,235,121 B1 * | 5/2001 | Honma | .............. | C23C 16/4401 118/715 |
| 6,412,289 B1 * | 7/2002 | Laskaris | .............. | H02K 9/193 62/50.7 |
| 2002/0017247 A1 * | 2/2002 | Sakai | .............. | C23C 14/505 118/730 |
| 2002/0139307 A1 * | 10/2002 | Ryding | .............. | C23C 14/505 118/730 |
| 2003/0044533 A1 * | 3/2003 | Lee | .............. | C23C 16/30 427/255.28 |
| 2004/0255858 A1 * | 12/2004 | Lee | .............. | C23C 16/4401 118/715 |
| 2005/0150455 A1 * | 7/2005 | Kobayashi | .............. | H01J 37/32192 118/715 |
| 2005/0255783 A1 * | 11/2005 | Hirata | .............. | H01J 9/266 445/26 |
| 2009/0117752 A1 * | 5/2009 | Ozaki | .............. | C23C 16/4408 438/795 |
| 2009/0277389 A1 * | 11/2009 | Kakimoto | .............. | C23C 16/4404 118/725 |
| 2010/0116209 A1 * | 5/2010 | Kato | .............. | C23C 16/45551 118/730 |
| 2013/0251896 A1 * | 9/2013 | Tonegawa | .............. | B05D 5/00 427/154 |
| 2013/0333620 A1 * | 12/2013 | Li | .............. | C23C 16/45563 118/728 |
| 2014/0072924 A1 * | 3/2014 | Kaneko | .............. | F27B 17/0025 432/198 |
| 2014/0102879 A1 * | 4/2014 | Nishioka | .............. | H01L 45/04 204/192.21 |
| 2014/0318457 A1 * | 10/2014 | Umezawa | .............. | C23C 16/4405 118/725 |
| 2015/0114835 A1 * | 4/2015 | Gomi | .............. | H01J 37/3423 204/298.08 |
| 2015/0255258 A1 * | 9/2015 | Nozawa | .............. | C23C 16/4584 156/345.42 |
| 2016/0276183 A1 * | 9/2016 | Ohashi | .............. | H01L 21/68764 |
| 2018/0076021 A1 * | 3/2018 | Fukushima | .............. | H01L 21/67017 |
| 2018/0202044 A1 * | 7/2018 | Huang | .............. | C23C 16/45572 |
| 2019/0177847 A1 * | 6/2019 | Tomizawa | .............. | H01L 21/68785 |
| 2019/0287830 A1 * | 9/2019 | Saido | .............. | F27B 9/30 |

* cited by examiner

D1-D1

D2-D2

D3-D3

GAS INJECTOR USED FOR SEMICONDUCTOR EQUIPMENT

CROSS-REFERENCE TO RELATED APPLICATIONS

This application claims priority to Taiwan Patent Application No. 106101498, filed on Jan. 17, 2017, the entire contents of which are herein expressly incorporated by reference.

BACKGROUND OF THE INVENTION

1. Field of the Invention

The present invention generally relates to a gas injector adaptable to semiconductor equipment, and more particularly to a gas injector with a rotating main shaft capable of vertically stacking gas transmission adaptable to a chemical vapor deposition (CVD) system.

2. Description of Related Art

In conventional chemical vapor deposition (CVD) systems for semiconductor manufacturing process, a gas injector includes a center fixed shaft, from which reaction gas enters. The reaction gas is then outputted to a susceptor, which is rotatable by a driving motor.

FIG. 1 shows a cross-sectional view illustrating a gas injector 100 of a conventional CVD system. The gas injector 100 includes a center fixed shaft 110, a susceptor 120, a ceiling 130 and a driving motor 140. The center fixed shaft 110 supports the susceptor 120 and connects to the ceiling 130. Reaction gas 114 enters the center fixed shaft 110 and reaches the susceptor 120. Specifically, different reaction gasses 114A-114C inject from the same layer into the susceptor 120 via an output unit 112. Moreover, the susceptor 120 and wafers thereon are rotated by an external driving motor 140. As a result, the reaction gases 114A-114C are liable to mix at an outlet of the output unit 112. The reaction gasses 114A-114C commonly lack temperature control or regulation. Further, the driving motor 140 occupies substantial volume in the CVD system.

A need has arisen to propose a novel gas injector adaptable to semiconductor equipment capable of injecting reaction gasses into a susceptor via vertically stacked gas output layers, and rotating the susceptor by a center shaft in order to reduce system volume.

SUMMARY OF THE INVENTION

In view of the foregoing, it is an object of the embodiment of the present invention to provide a gas injector adaptable to a chemical vapor deposition (CVD) system for semiconductor manufacturing process. The gas injector of the embodiment includes magnetic fluid seals that facilitate vertically stacking gas transmission. Reaction gases enter the gas injector and are then injected from respective layers into a chamber.

According to one embodiment, a gas injector used for semiconductor equipment includes a housing shell, a rotating main shaft and a gas output distribution unit. The rotating main shaft is covered with the housing shell, and includes a plurality of magnetic fluid seals and a plurality of gas transmission tubes. The magnetic fluid seals are disposed at intervals, and a gas input cavity is defined by adjacent magnetic fluid seals and the housing shell for inputting a reaction gas. The gas transmission tubes are disposed in the magnetic fluid seals for transmitting the reaction gas. The gas output distribution unit is coupled to a top end of the rotating main shaft, the gas output distribution unit being connected to a ceiling and a susceptor. The gas output distribution unit includes a plurality of boards spaced at intervals between the ceiling and the susceptor, thereby resulting in a plurality of gas output layers for outputting corresponding reaction gases.

DETAILED DESCRIPTION OF THE INVENTION

Figure 1:
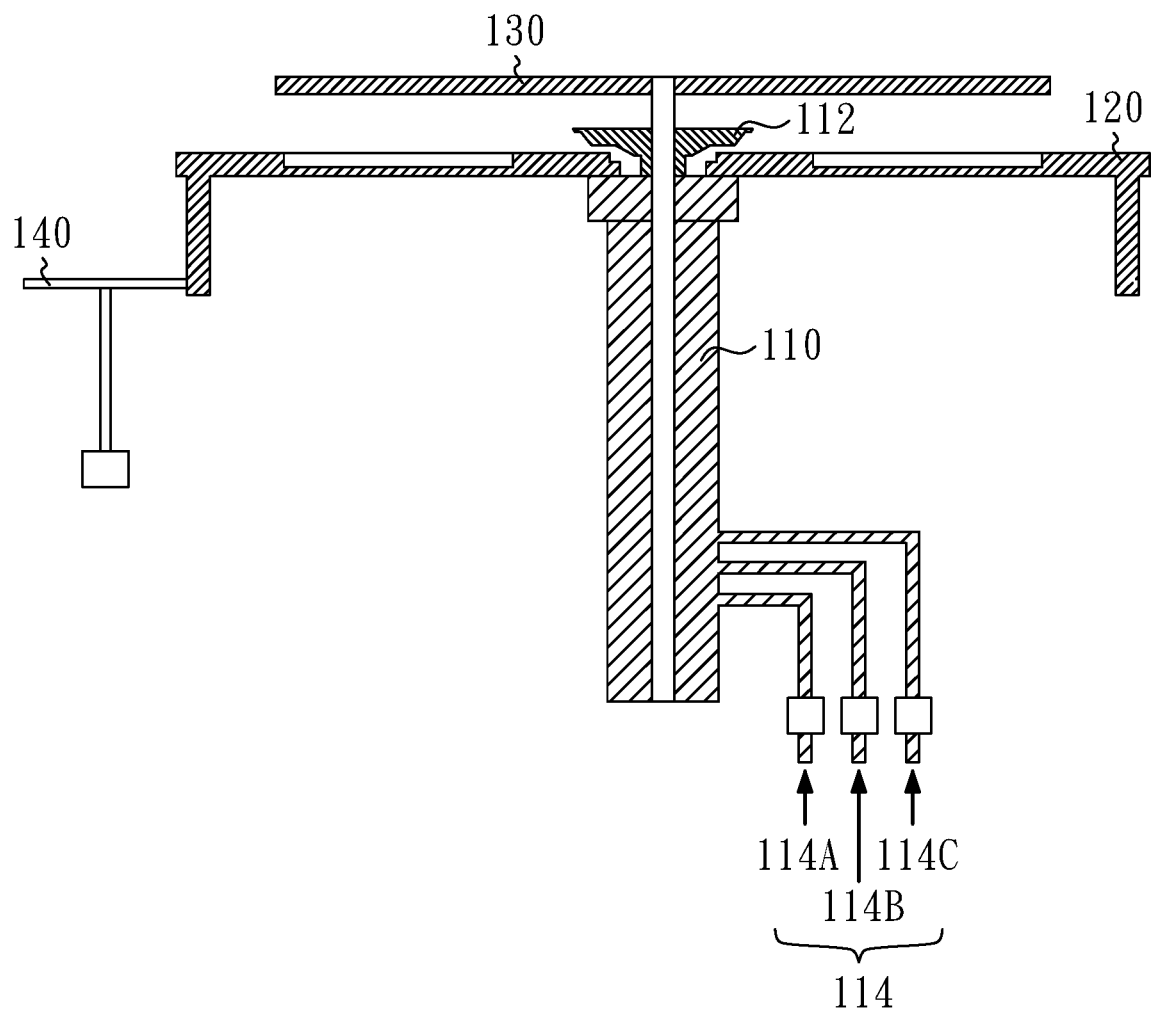
FIG. 1 shows a cross-sectional view illustrating a gas injector of a conventional CVD system.
Figure 2A:
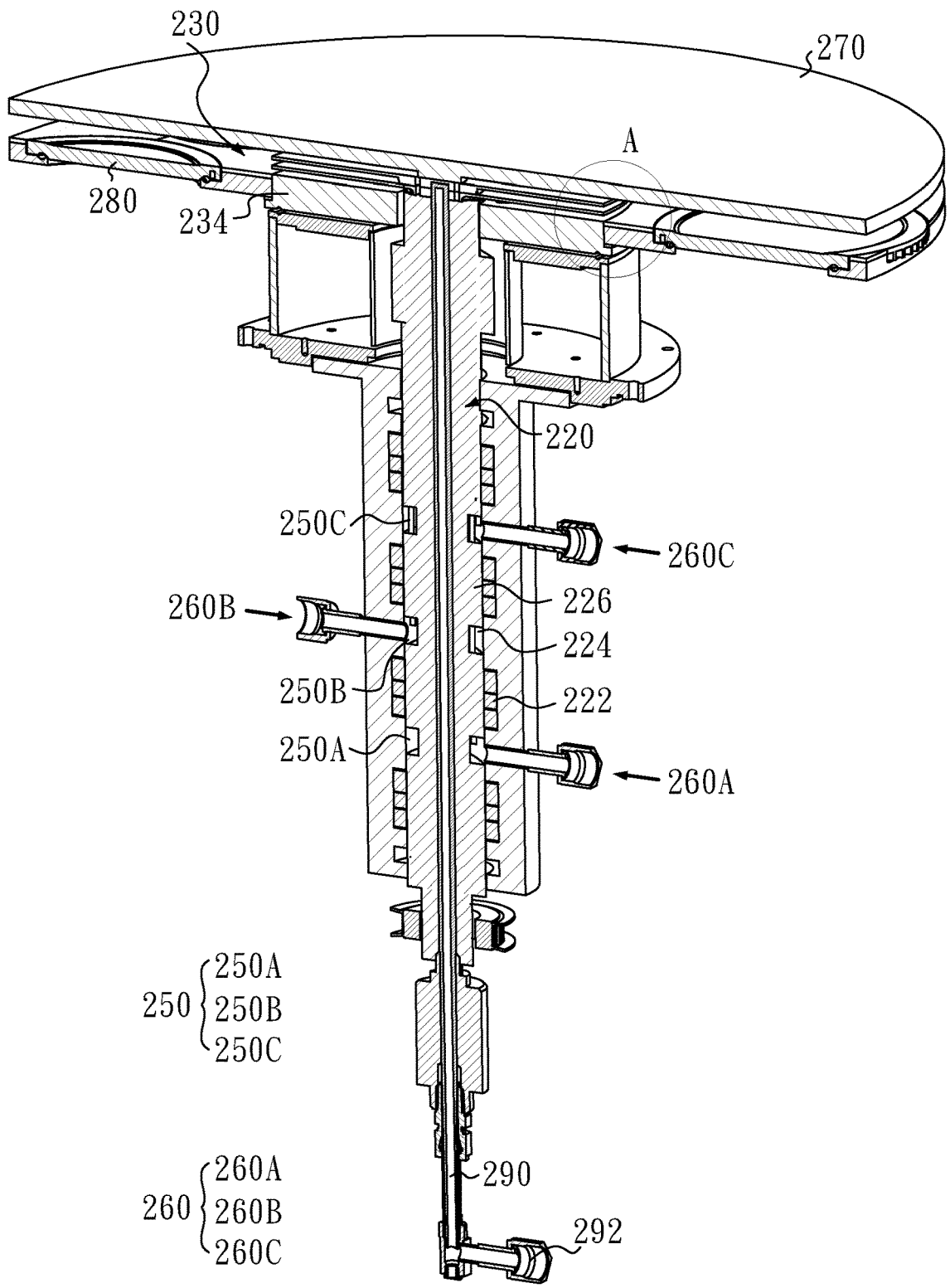
FIG. 2A shows a cross-sectional view illustrating a gas injector adaptable to semiconductor equipment according to one embodiment of the present invention.
Figure 2B:
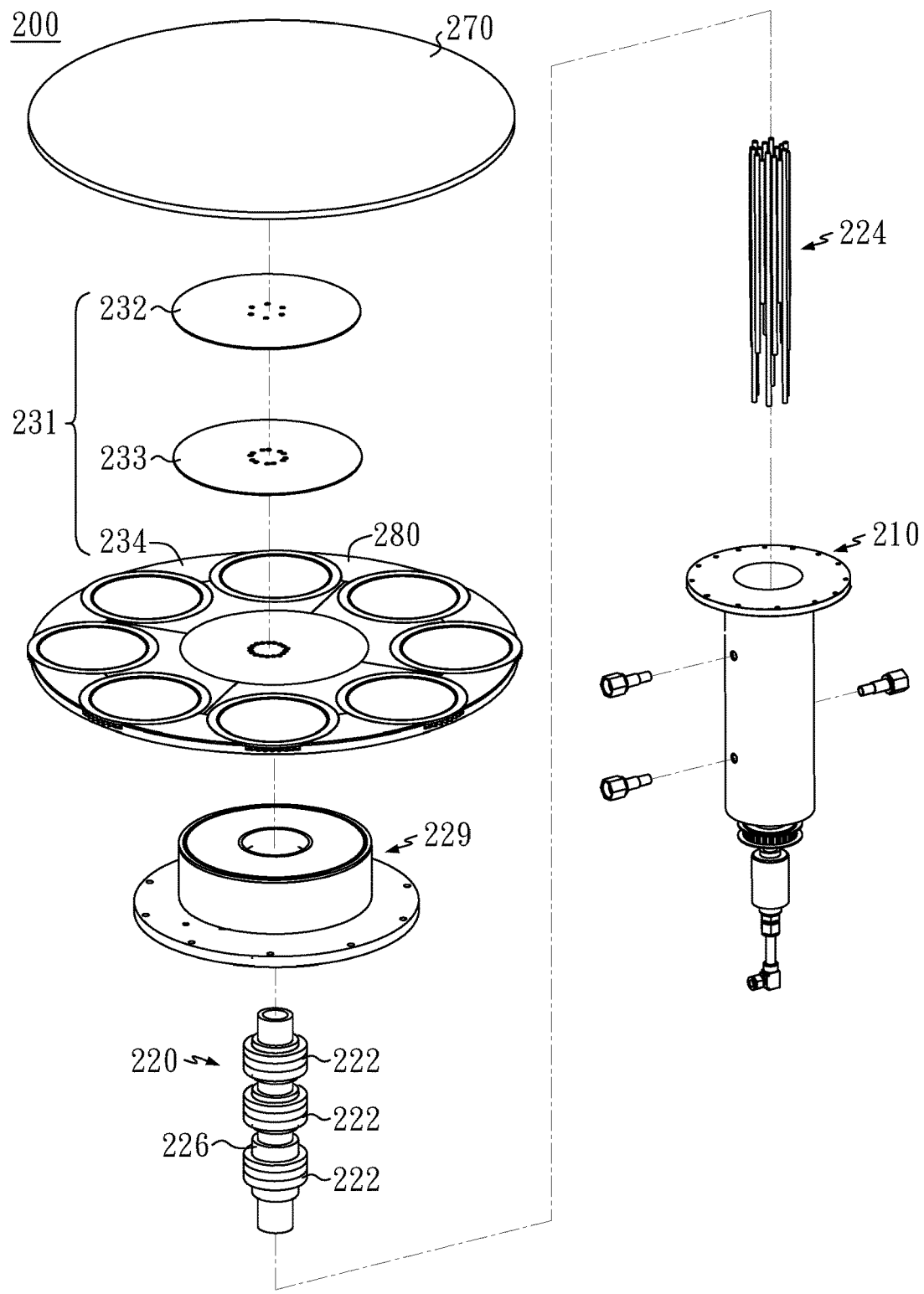
FIG. 2B shows an exploded view of the gas injector of FIG. 2A.

FIG. 2A shows a cross-sectional view illustrating a gas injector 200 adaptable to semiconductor equipment according to one embodiment of the present invention, and FIG. 2B shows an exploded view of the gas injector 200 of FIG. 2A. The gas injector 200 may include a housing shell 210, a rotating main shaft 220 and a gas output distribution unit 230. The rotating main shaft 220 is covered with the housing shell 210, and the rotating main shaft 220 may include a plurality of magnetic fluid seals (or Ferrofluid seals) 222 and a plurality of gas transmission tubes 224. The magnetic fluid seals 222 are disposed at intervals, and a gas input cavity 250 is defined by adjacent magnetic fluid seals 222 and the housing shell 210 for inputting a reaction gas 260. The gas transmission tube 224 is disposed in the rotating main shaft 220 for transmitting the reaction gas 260. The gas output distribution unit 230 is coupled to a top end of the rotating main shaft 220, and the gas output distribution unit 230 may be connected to a ceiling 270 and a susceptor 280 at two ends thereof. The gas output distribution unit 230 may include a plurality of boards 231 spaced at intervals between the ceiling 270 and the susceptor 280, thus resulting in a plurality of gas output layers 240 for outputting corresponding reaction gases 260.

As exemplified in FIG. 2A, the boards 231 and the ceiling 270 of the embodiment are connected in sequence to the top end of the rotating main shaft 220, and the susceptor 280 is connected to the top end of the rotating main shaft 220 via a connecting part 229. Accordingly, wafers disposed on the susceptor 280 face up during a manufacturing process.

Figure 2C:
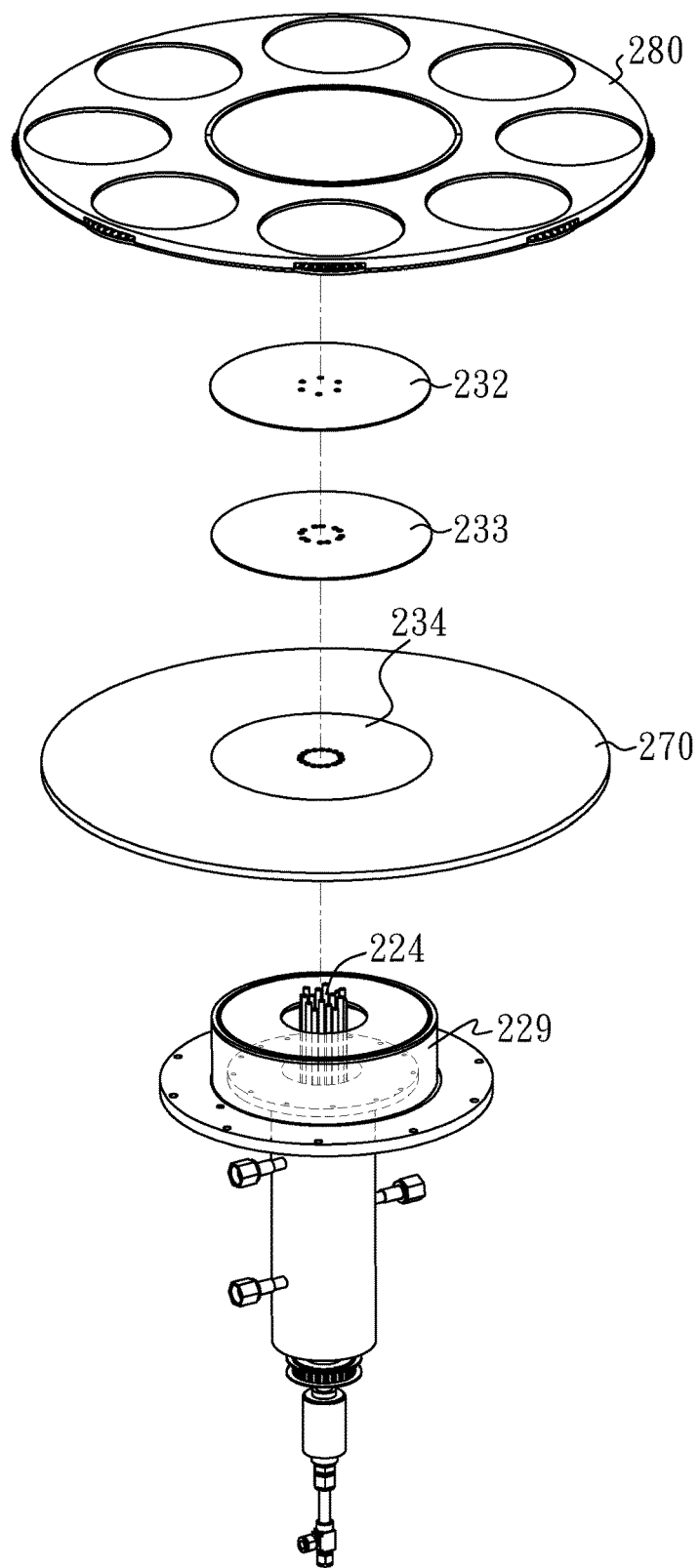
FIG. 2C shows an exploded view illustrating a gas injector adaptable to semiconductor equipment according to another embodiment of the present invention.

The connection relationship among the boards 231, the ceiling 270 and the susceptor 280 may be altered according to specific processes and design requirements. FIG. 2C shows an exploded view illustrating a gas injector 200 adaptable to semiconductor equipment according to another embodiment of the present invention. In the embodiment, the ceiling 270, the boards 231 and the susceptor 280 are connected in sequence to the top end of the rotating main shaft 220, and the ceiling 270 is connected to the top end of the rotating main shaft 220 via a connecting part 229. Accordingly, wafers disposed on the susceptor 280 face down during a manufacturing process.

In the embodiment, the gas injector 200 may further include a cooling unit 290 disposed at a center of the rotating main shaft 220. The cooling unit 290 is configured to circulate a cooling liquid through the rotating main shaft 220. Specifically, the cooling liquid enters a passage port 292 disposed at a bottom end of the cooling unit 290, and then flows to a top end of the rotating main shaft 220 in order to carry off heat generated in the ceiling 270, the boards 231 and the susceptor 280 and finally exits from the passage port 292, thereby effectively achieving temperature regulation.

In the embodiment, as exemplified in FIG. 2A, reaction gases 260 inputting to the gas input cavities 250 may be different. For example, reaction gas 260 may include organic metal molecule with carrier gas, or may include group 5 element with carrier gas. Different reaction gases 260 enter the rotating main shaft 220 via associated gas input cavities 250, respectively. When the rotating main shaft 220 is rotating, the magnetic fluid seals 222 provide gas seal to prevent different reaction gases 260 from mixing. The reaction gasses 260 are then injected into a chamber via the vertically stacked gas output layers 240 of the gas output distribution unit 230.

In the embodiment, the rotating main shaft 220 may further include a plurality of projection parts 226 spaced at intervals, and each magnetic fluid seal 222 is coupled with a corresponding projection part 226, and the gas transmission tubes 224 are disposed in the projection parts 226. Specifically, each gas input cavity 250 is individually and isolatedly defined by the adjacent projection parts 226 and the housing shell 210. Further, the gas transmission tubes 224 are embedded in the projection parts 224 by brazing to prevent mixing or leaking of reaction gasses 260 of the gas input cavities 250.

Figure 3:
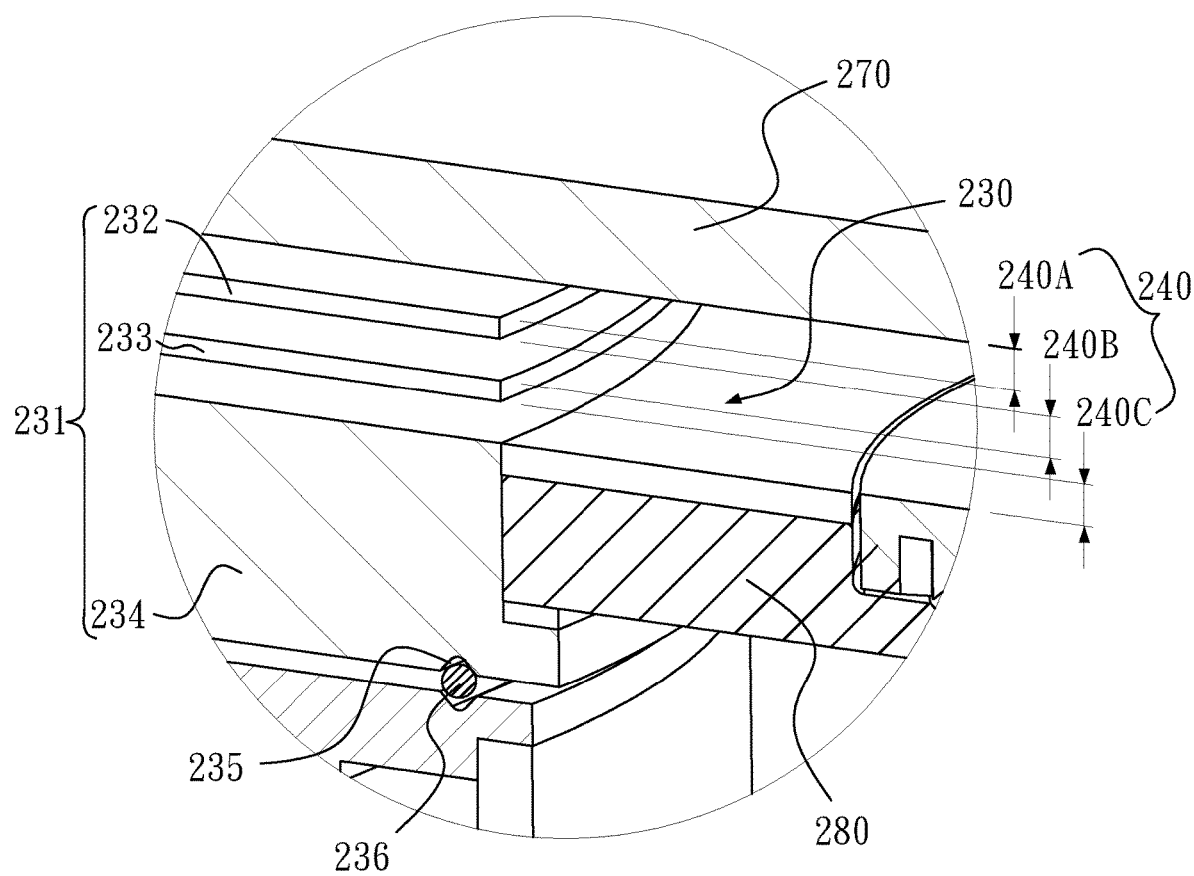
FIG. 3 shows an enlarged cross-sectional view of a portion A of FIG. 2A.

In the embodiment, the rotating main shaft 220 includes four magnetic fluid seals 222, which are disposed at intervals with respect to the housing shell 210 to result in a first gas input cavity 250A, a second gas input cavity 250B and a third gas input cavity 250C for inputting first reaction gas 260A, second reaction gas 260B and third reaction gas 260C, respectively. FIG. 3 shows an enlarged cross-sectional view of a portion A of FIG. 2A. The boards 231 of the gas output distribution unit 230 of the embodiment include a top board 232, a middle board 233 and a bottom board 234, which form vertically stacked gas output layers 240 including a first gas output layer 240A, a second gas output layer 240B and a third gas output layer 240C.

Figure 2D:
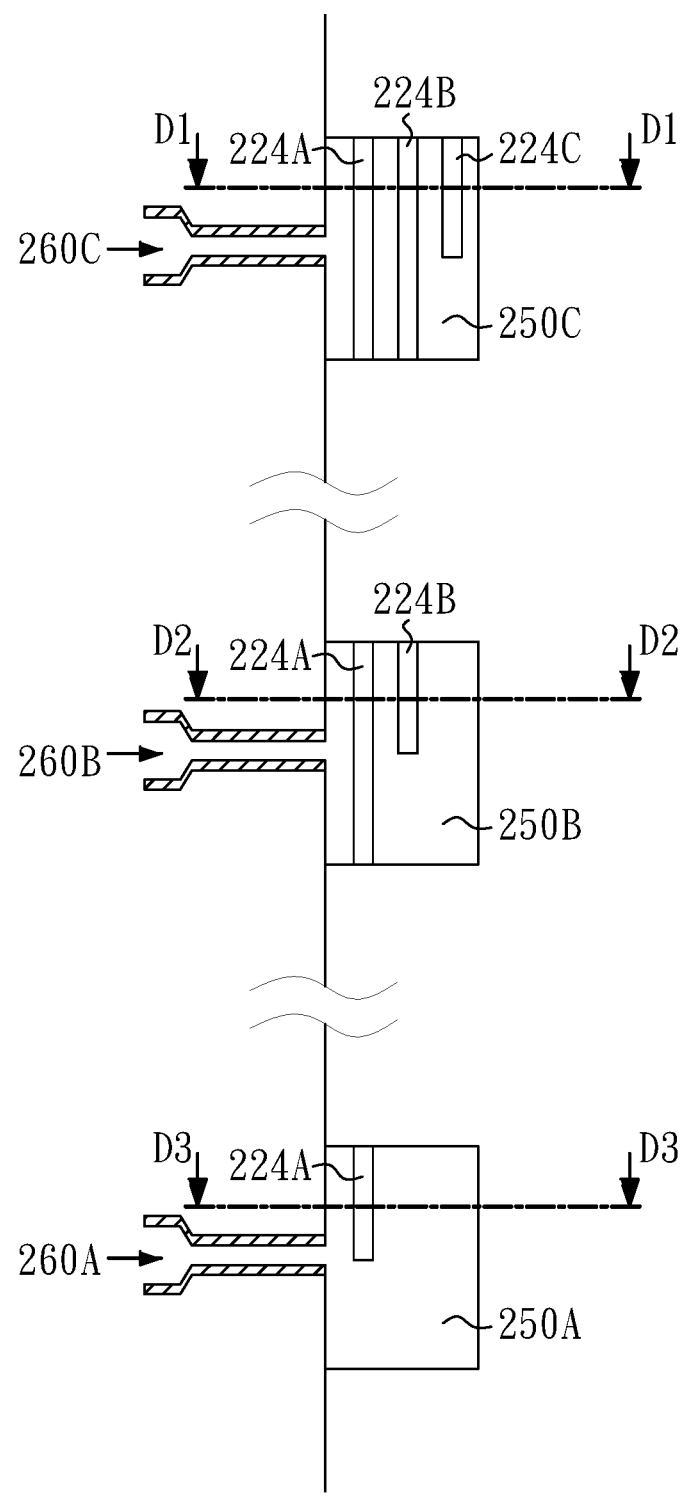
FIG. 2D shows a schematic diagram illustrating the gas transmission tubes of the rotating main shaft.
Figure 2E:
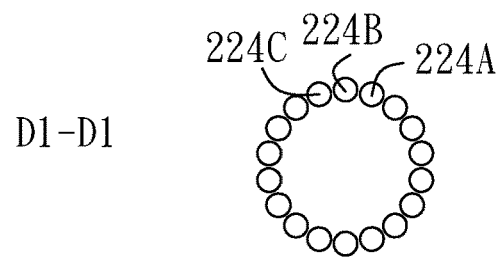
FIG. 2E shows a cross-sectional view along a first section line D1-D1 of FIG. 2D.
Figure 2F:
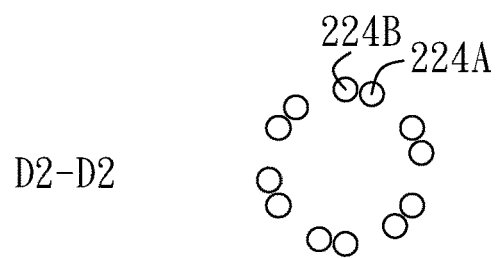
FIG. 2F shows a cross-sectional view along a second section line D2-D2 of FIG. 2D.
Figure 2G:
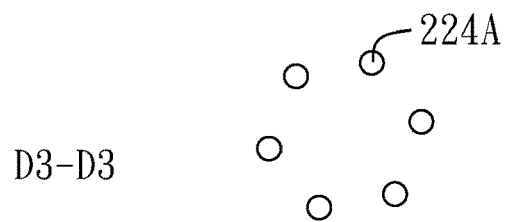
FIG. 2G shows a cross-sectional view along a third section line D3-D3 of FIG. 2D.
Figure 2H:
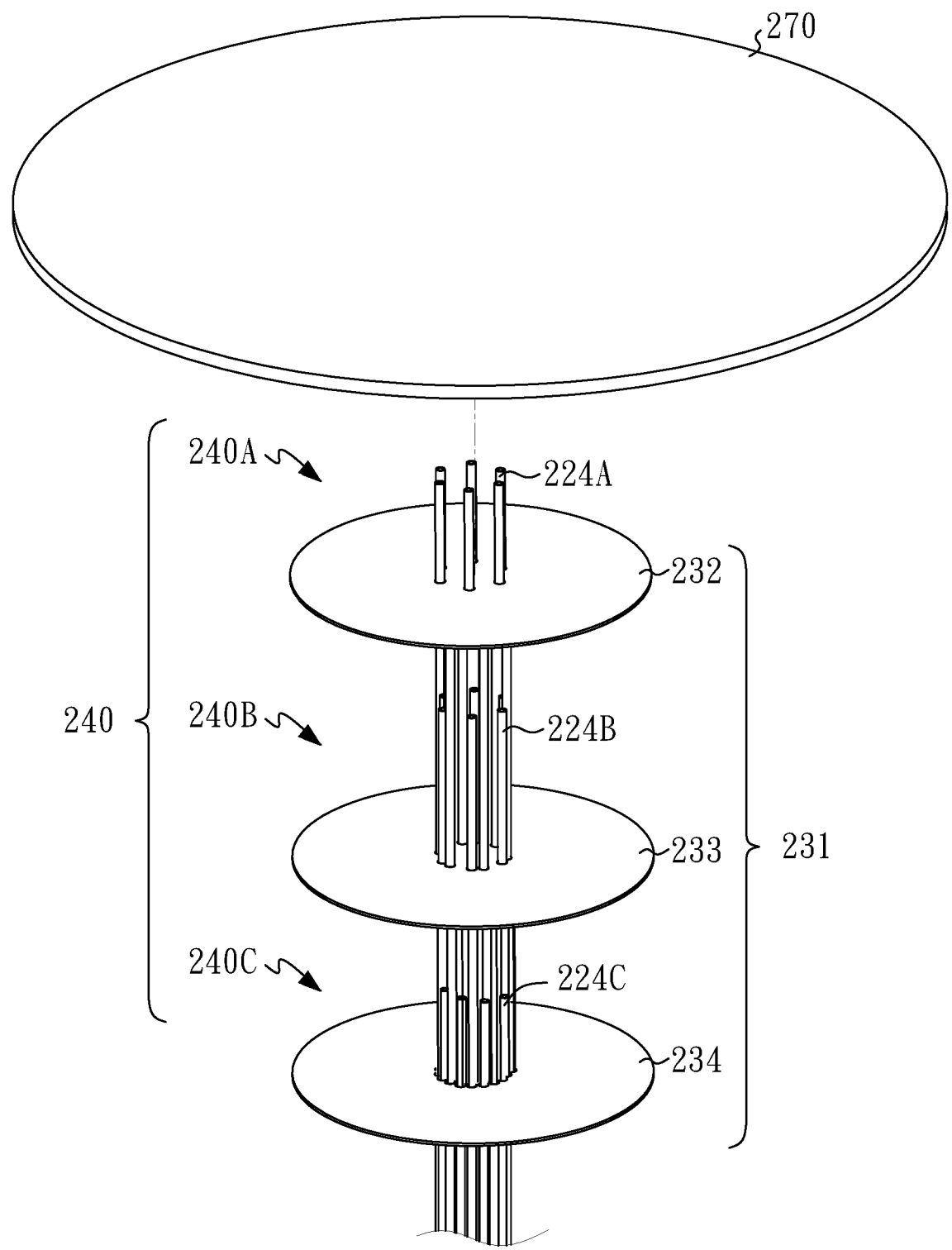
FIG. 2H shows a perspective view of the gas transmission tubes and the gas output layers.

FIG. 2D shows a schematic diagram illustrating the gas transmission tubes 224 of the rotating main shaft 220, and FIG. 2E to FIG. 2G respectively show cross-sectional views along a first section line D1-D1, a second section line D2-D2 and a third section line D3-D3 of FIG. 2D, and FIG. 2H shows a perspective view of the gas transmission tubes 224 and the gas output layers 240. Specifically, the gas transmission tubes 224 may include a plurality of first gas transmission tubes 224A, a plurality of second gas transmission tubes 224B and a plurality of third gas transmission tubes 224C. An inlet and an outlet of each first gas transmission tube 224A are disposed in the first gas input cavity 250A and the first gas output layer 240A, respectively, for transmitting the first reaction gas 260A from the first gas input cavity 250A to the first gas output layer 240A and then injecting the first reaction gas 260A into the chamber. Similarly, an inlet and an outlet of each second gas transmission tube 224B are disposed in the second gas input cavity 250B and the second gas output layer 240B, respectively, for transmitting the second reaction gas 260B from the second gas input cavity 250B to the second gas output layer 240B and then injecting the second reaction gas 260B into the chamber. An inlet and an outlet of each third gas transmission tube 224C are disposed in the third gas input cavity 250C and the third gas output layer 240C, respectively, for transmitting the third reaction gas 260C from the third gas input cavity 250C to the third gas output layer 240C and then injecting the third reaction gas 260C into the chamber.

In one embodiment, there are N first gas transmission tubes 224A, N second gas transmission tubes 224B and N third gas transmission tubes 224C, where N is a positive integer greater than 2. As exemplified in FIG. 2D, there are six first gas transmission tubes 224A, six second gas transmission tubes 224B and six third gas transmission tubes 224C. Moreover, the inlets and outlets of the first gas transmission tubes 224A are evenly distributed in the first gas input cavity 250A and the first gas output layer 240A respectively, the inlets and outlets of the second gas transmission tubes 224B are evenly distributed in the second gas input cavity 250B and the second gas output layer 240B respectively, and the inlets and outlets of the third gas transmission tubes 224C are evenly distributed in the third gas input cavity 250C and the third gas output layer 240C respectively.

As shown in FIG. 3, which shows the enlarged cross-sectional view of the portion A of FIG. 2A, the bottom board 234 of the embodiment may be fixed to the susceptor 280 according to specific manufacturing processes. The bottom board 234 may have an auxiliary groove 235 disposed on a bottom surface of the bottom board 234, and a plurality of balls 236 acting as bearing disposed in the auxiliary groove 235 for rotating the rotating main shaft 220. The balls 236 of the embodiment may be made of, but not limited to, ceramics and are, for example, sphere in shape.

The boards 231 (e.g., the top board 232, the middle board 233 and the bottom board 234) of the gas output distribution unit 230, the ceiling 270 and the susceptor 280 may be detachable for enhancing operational convenience according to specific manufacturing processes.

In one embodiment, at least one of the top board 232, the middle 233 and the bottom board 234 of the boards 231 is disposed horizontally while others are slanted, thus modifying flow rate and distribution of the reaction gases 260 injected from the gas output layers 240. In another embodiment, a board 231 may be thicker at a center than on the periphery, or a board 231 may be thinner at a center than on the periphery, thus modifying cross section of a gas outlet of the gas output layer 240 and flow rate and distribution of the reaction gases 260 injected from the gas output layers 240.

Figure 2I:
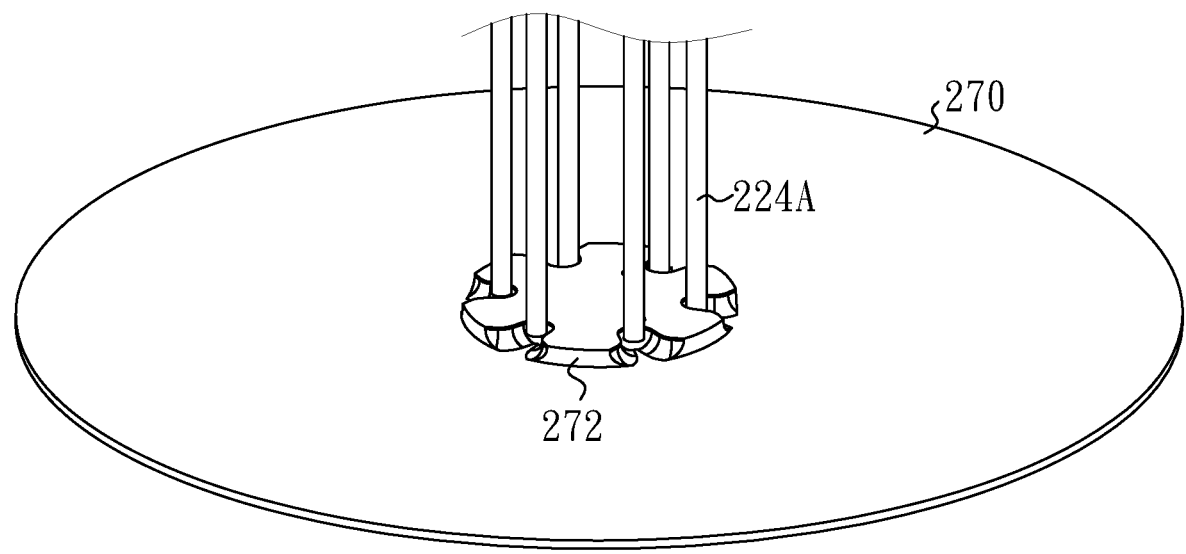
FIG. 2I shows a perspective view illustrating the ceiling and the first gas transmission tube according to one embodiment of the present invention.

FIG. 2I shows a perspective view illustrating the ceiling 270 and the first gas transmission tube 224A according to one embodiment of the present invention. In the embodiment, the ceiling 270 may further include a pad 272 disposed at a center of the ceiling 270. The pad 272 may be connected to the board 231 underlying the ceiling 270. Further, the pad 272 may have a plurality of indentations that correspond to the outlet of the first gas transmission tube 224A, thus concentrating the first reaction gas 260A toward the outlet of the first gas output layer 240A. Similarly, other boards 231 such as the top board 232 or the middle board 233 may include a pad and have indentations for concentrating the reaction gas 260.

Although specific embodiments have been illustrated and described, it will be appreciated by those skilled in the art that various modifications may be made without departing from the scope of the present invention, which is intended to be limited solely by the appended claims.

What is claimed is:

1. A gas injector used for semiconductor equipment, comprising:
    a housing shell;
    a rotating main shaft covered with the housing shell, the rotating main shaft comprising:
        a plurality of magnetic fluid seals disposed at intervals, a gas input cavity being defined by adjacent magnetic fluid seals and the housing shell for inputting a reaction gas; and
        a plurality of gas transmission tubes disposed in the magnetic fluid seals for transmitting the reaction gas;
    a gas output distribution unit coupled to a top end of the rotating main shaft, the gas output distribution unit being connected to a ceiling and a susceptor, the gas output distribution unit comprising:
        a plurality of boards spaced at intervals between the ceiling and the susceptor, thereby resulting in a plurality of gas output layers for outputting corresponding reaction gases.

2. The gas injector of claim 1, wherein the ceiling is connected to the top end of the rotating main shaft, and the susceptor is connected to the top end of the rotating main shaft via a connecting part.

3. The gas injector of claim 1, wherein the susceptor is connected to the top end of the rotating main shaft, and the ceiling is connected to the top end of the rotating main shaft via a connecting part.

4. The gas injector of claim 1, wherein the rotating main shaft have a plurality of the gas input cavities for inputting different reaction gases respectively.

5. The gas injector of claim 1, wherein the rotating main shaft comprises a plurality of projection parts spaced at intervals, and each said magnetic fluid seal is coupled with corresponding said projection part, and the gas transmission tubes are disposed in the projection parts.

6. The gas injector of claim 5, wherein the gas transmission tubes are embedded in the projection parts by brazing.

7. The gas injector of claim 1, wherein the rotating main shaft comprises four magnetic fluid seals, which are disposed at intervals with respect to the housing shell to result in a first gas input cavity, a second gas input cavity and a third gas input cavity for inputting first reaction gas, second reaction gas and third reaction gas respectively.

8. The gas injector of claim 7, wherein the gas output distribution unit comprises a top board, a middle board and a bottom board, which form vertically stacked gas output layers including a first gas output layer, a second gas output layer and a third gas output layer.

9. The gas injector of claim 8, wherein the gas transmission tubes comprise:
    a plurality of first gas transmission tubes, an inlet and an outlet of each said first gas transmission tube being disposed in the first gas input cavity and the first gas output layer respectively, for transmitting the first reaction gas from the first gas input cavity to the first gas output layer for injection;
    a plurality of second gas transmission tubes, an inlet and an outlet of each said second gas transmission tube being disposed in the second gas input cavity and the second gas output layer respectively, for transmitting the second reaction gas from the second gas input cavity to the second gas output layer for injection; and
    a plurality of third gas transmission tubes, an inlet and an outlet of each said third gas transmission tube being disposed in the third gas input cavity and the third gas output layer respectively, for transmitting the third reaction gas from the third gas input cavity to the third gas output layer for injection.

10. The gas injector of claim 9, wherein there are N said first gas transmission tubes, N said second gas transmission tubes and N said third gas transmission tubes, where N is a positive integer greater than 2.

11. The gas injector of claim 10, wherein the inlets and outlets of the first gas transmission tubes are evenly distributed in the first gas input cavity and the first gas output layer respectively, the inlets and outlets of the second gas transmission tubes are evenly distributed in the second gas input cavity and the second gas output layer respectively, and the inlets and outlets of the third gas transmission tubes are evenly distributed in the third gas input cavity and the third gas output layer respectively.

12. The gas injector of claim 8, wherein the bottom board is fixed to the susceptor, and the bottom board has an auxiliary groove disposed on a bottom surface of the bottom board, and a plurality of balls acting as bearing disposed in the auxiliary groove for rotating the rotating main shaft.

13. The gas injector of claim 12, wherein the balls comprise ceramics.

14. The gas injector of claim 1, wherein the boards of the gas output distribution unit, the ceiling and the susceptor are detachable.

15. The gas injector of claim 1, wherein at least one of the boards is disposed horizontally while others are slanted.

16. The gas injector of claim 1, wherein at least one said board is thicker at a center than on the periphery, or at least one said board is thinner at a center than on the periphery.

17. The gas injector of claim 1, further comprising a cooling unit disposed at a center of the rotating main shaft, the cooling unit circulating a cooling liquid through the rotating main shaft.

* * * * *